US010593712B2

(12) United States Patent
Borthakur

(10) Patent No.: US 10,593,712 B2
(45) Date of Patent: Mar. 17, 2020

(54) IMAGE SENSORS WITH HIGH DYNAMIC RANGE AND INFRARED IMAGING TOROIDAL PIXELS

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 59 days.

(21) Appl. No.: 15/684,084

(22) Filed: Aug. 23, 2017

(65) Prior Publication Data

US 2019/0067346 A1 Feb. 28, 2019

(51) Int. Cl.
*H01L 27/146* (2006.01)
*H04N 5/355* (2011.01)
(Continued)

(52) U.S. Cl.
CPC .... *H01L 27/14605* (2013.01); *G02B 6/12019* (2013.01); *G03B 13/36* (2013.01);
(Continued)

(58) Field of Classification Search
CPC ............. H04N 5/23212; H04N 5/2259; H04N 5/3696; H04N 5/35563; H04N 9/045;
(Continued)

(56) References Cited

U.S. PATENT DOCUMENTS 4,989,060 A * 1/1991 Usui ................. H01L 27/14831
250/208.1
5,311,337 A 5/1994 McMcartney
(Continued)

FOREIGN PATENT DOCUMENTS

EP 1389876 A1 2/2004
EP 2442555 A2 4/2012
(Continued)

OTHER PUBLICATIONS

Yabushita, A. and Ogawa. K., "Image reconstruction with a hexagonal grid", IEEE Nuclear Science Symposium Conference Record, 3, 1500-1503 (2002).
(Continued)

*Primary Examiner* — Twyler L Haskins
*Assistant Examiner* — Akshay Trehan
(74) *Attorney, Agent, or Firm* — Treyz Law Group, P.C.; Tianyi He

(57) ABSTRACT

An image sensor may include phase detecting and autofocusing (PDAF) pixels. Each pixel may include an inner photodiode region and outer photodiode regions to provide high dynamic range (HDR) capability. Each pixel may include an in infrared blocking filter that selectively covers the inner photodiode region or the outer photodiode regions. Two pixels of the same color but with different infrared blocking filter patterns may be compared to provide infrared sensing. Any color filter array configuration can be used. Instead of an infrared blocking filter, an infrared pass filter may also be used. A first pixel may include an infrared pass filter that selectively covers the inner photodiode region, whereas a second pixel may include an infrared pass filter that selectively covers the outer photodiode regions. The charge collected by the first and second pixels may be compared to provide infrared sensing.

8 Claims, 16 Drawing Sheets

(51) Int. Cl.
*H04N 9/04* (2006.01)
*H04N 5/232* (2006.01)
*H04N 5/369* (2011.01)
*H04N 5/33* (2006.01)
*H04N 5/225* (2006.01)
*G02B 6/12* (2006.01)
*G03B 13/36* (2006.01)

(52) U.S. Cl.
CPC .. *H01L 27/14607* (2013.01); *H01L 27/14627* (2013.01); *H01L 27/14643* (2013.01); *H04N 5/2259* (2013.01); *H04N 5/23212* (2013.01); *H04N 5/232122* (2018.08); *H04N 5/33* (2013.01); *H04N 5/35563* (2013.01); *H04N 5/3696* (2013.01); *H04N 9/04553* (2018.08)

(58) Field of Classification Search
CPC .......... H04N 9/04553; H04N 9/04559; H04N 5/232121; H04N 5/232122; H04N 5/232123; H04N 5/232125; H04N 5/232127; H04N 5/232133; G02B 6/12019; G03B 13/36; H01L 27/14605; H01L 27/14603; H01L 27/14607; H01L 27/14627; H01L 27/14643
USPC ................. 348/345, 349, 350; 250/208.1
See application file for complete search history.

(56) References Cited

U.S. PATENT DOCUMENTS

| | | | |
|---|---|---|---|
| 7,382,010 B2 | 6/2008 | Chio | |
| 7,414,630 B2 | 8/2008 | Schweng et al. | |
| 7,511,323 B2 | 3/2009 | Mckee | |
| 2004/0105021 A1 | 6/2004 | Hu | |
| 2007/0018073 A1 | 1/2007 | Hsu et al. | |
| 2007/0171290 A1 | 7/2007 | Kroger | |
| 2008/0067330 A1* | 3/2008 | Yamamoto | G01J 3/51 250/226 |
| 2008/0087800 A1* | 4/2008 | Toda | H01L 27/14603 250/214 C |
| 2008/0258187 A1* | 10/2008 | Ladd | H01L 27/14603 257/292 |
| 2010/0020209 A1* | 1/2010 | Kim | H04N 3/155 348/294 |
| 2010/0033611 A1* | 2/2010 | Lee | H01L 27/14645 348/302 |
| 2011/0057282 A1 | 3/2011 | Ellis-Monaghan et al. | |
| 2011/0175981 A1* | 7/2011 | Lai | H01L 27/14621 348/46 |
| 2012/0087645 A1* | 4/2012 | Wu | H04N 5/33 396/439 |
| 2012/0113302 A1* | 5/2012 | Tajiri | H01L 27/14621 348/273 |
| 2015/0146054 A1* | 5/2015 | Vaartstra | H04N 9/045 348/280 |
| 2015/0341577 A1* | 11/2015 | Nakagawara | H04N 5/2355 348/250 |
| 2015/0350583 A1 | 12/2015 | Mauritzson et al. | |
| 2016/0105622 A1* | 4/2016 | Tamaki | H04N 5/3696 348/322 |
| 2016/0150175 A1 | 5/2016 | Hynecek | |
| 2017/0026622 A1* | 1/2017 | Yoon | H04N 9/045 |
| 2017/0373105 A1* | 12/2017 | Galor Gluskin | H01L 27/14603 |

FOREIGN PATENT DOCUMENTS

| | | |
|---|---|---|
| EP | 2738812 A1 | 6/2014 |
| EP | 2822036 A2 | 1/2015 |
| WO | 2012033578 A1 | 6/2012 |

OTHER PUBLICATIONS

Middleton, L. and Sivaswamy. J., "Edge detection in a hexagonal-image processing framework", Image and Vision Computing, 19(14), 1071-1081 (2001).

Middleton, L. and Sivaswamy.J., "Framework for practical hexagonal-image processing", Journal of Electronic Imaging, 11(1), 104-114 (Jan. 1, 2002). doi:10.1117/1.1426078.

Qiang Wu, Xiangjian He, Tom Hintz, "Image segmentation on spiral architecture", Proceedings of the Pan-Sydney area workshop on Visual information processing , Australian Computer Society Inc, 11(1), (2001).

Luczak, E. and Rosenfeld, A., "Distance on a Hexagonal Grid". IEEE Transactions on Computers, 25(5),532-533 (1976).

Staunton, Richard C. and Storey Neil, "A comparison between square and hexagonal sampling methods for pipeline image processing", Proc.SPIE, vol. 1194, 142-151 (1989).

Alexander Fröhlich and Andreas Unterweger "A novel color filter array and demosaicking algorithm for hexagonal grids", Proc. SPIE 9443, Sixth International Conference on Graphic and Image Processing (ICGIP 2014), 94432T (Mar. 4, 2015); doi:10.1117/12.2179849.

Milinar et al., U.S. Appl. No. 15/145,374, filed May 3, 2016.
Mlinar et al., U.S. Appl. No. 15/184,170, filed Jun. 16, 2016.

* cited by examiner

◨ GREEN
◨ RED
◨ BLUE

☐ GREEN
☐ RED
☒ BLUE

☐ GREEN
☐ RED
☒ BLUE

▨ GREEN
▧ RED
▨ BLUE

▨ GREEN
▧ RED
▨ BLUE

◪ GREEN  ☐ CLEAR
◩ RED    ▨ IR PASS
◨ BLUE

◪ GREEN  ☐ CLEAR
◩ RED    ▨ IR PASS
◨ BLUE

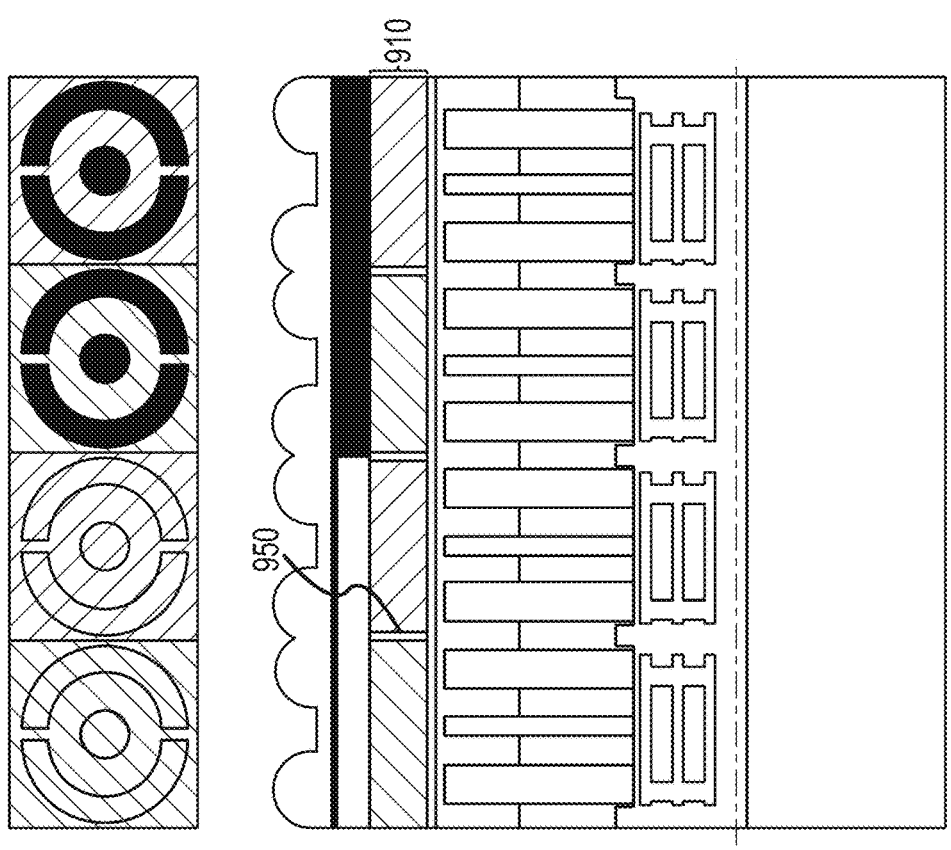
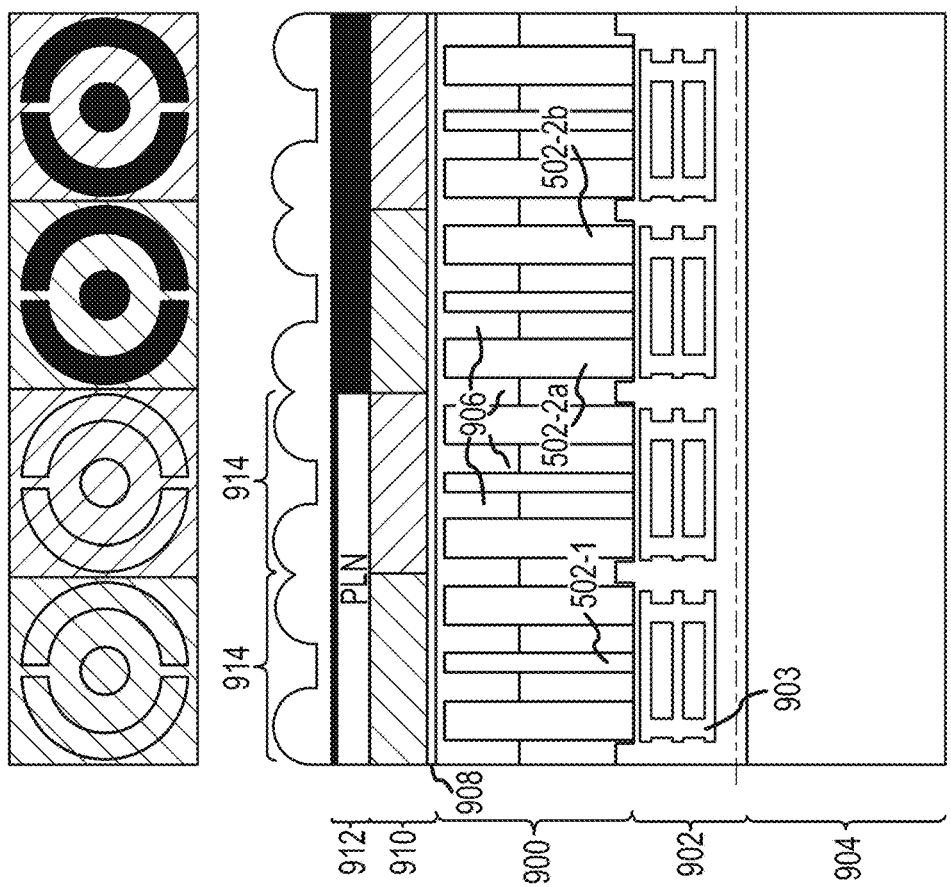
FIG. 10A
FIG. 10B

IMAGE SENSORS WITH HIGH DYNAMIC RANGE AND INFRARED IMAGING TOROIDAL PIXELS

BACKGROUND

This relates generally to imaging systems and, more particularly, to imaging systems with high dynamic range functionalities and infrared imaging capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Conventional imaging systems also may have images with artifacts associated with low dynamic range. Scenes with bright and dark portions may produce artifacts in conventional image sensors, as portions of the low dynamic range images may be over exposed or under exposed. Multiple low dynamic range images may be combined into a single high dynamic range image, but this typically introduces motion artifacts, especially in dynamic scenes with non-static objects.

It is within this context that the embodiments herein arise.

BRIEF DESCRIPTION OF THE DRAWINGS

FIGS. 10A and 10B are cross-sectional side views of image sensors in which the infrared blocking filters are formed above the color filter array in accordance with at least some embodiments.

DETAILED DESCRIPTION

Embodiments of the present invention relate to image sensors with high dynamic range (HDR) functionalities and infrared (IR) sensing capabilities.

Figure 1:
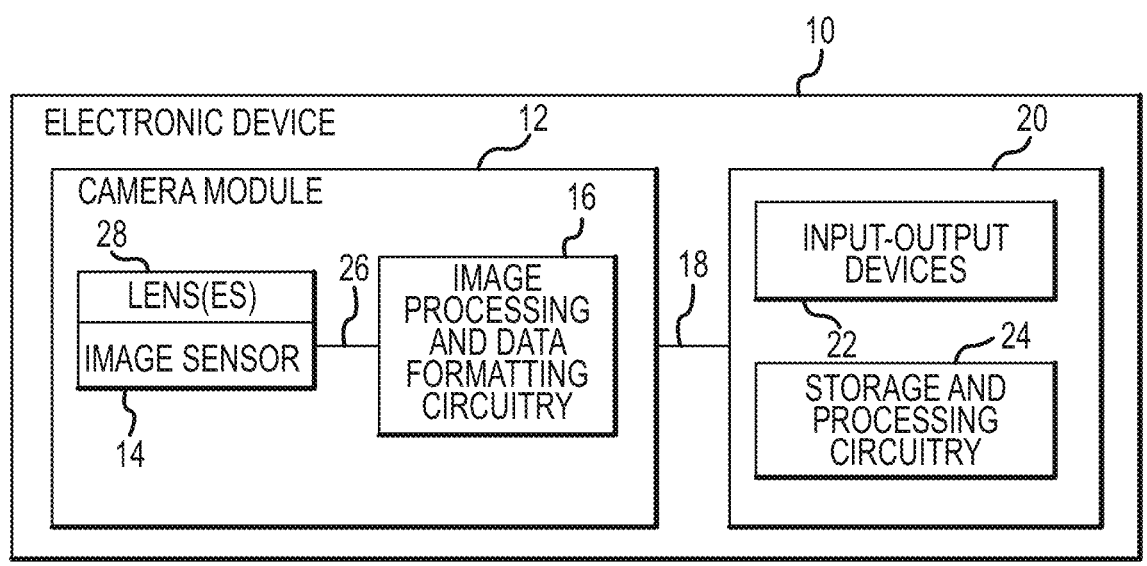
FIG. 1 is a schematic diagram of an illustrative electronic device with an image sensor that may include phase detection pixels in accordance with an embodiment.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit.

The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Image sensors may sometimes be provided with high dynamic range functionalities (e.g., to use in low light and bright environments to compensate for high light points of interest in low light environments and vice versa). To provide high dynamic range functionalities, image sensor 14 may include high dynamic range pixels.

Figure 2A:
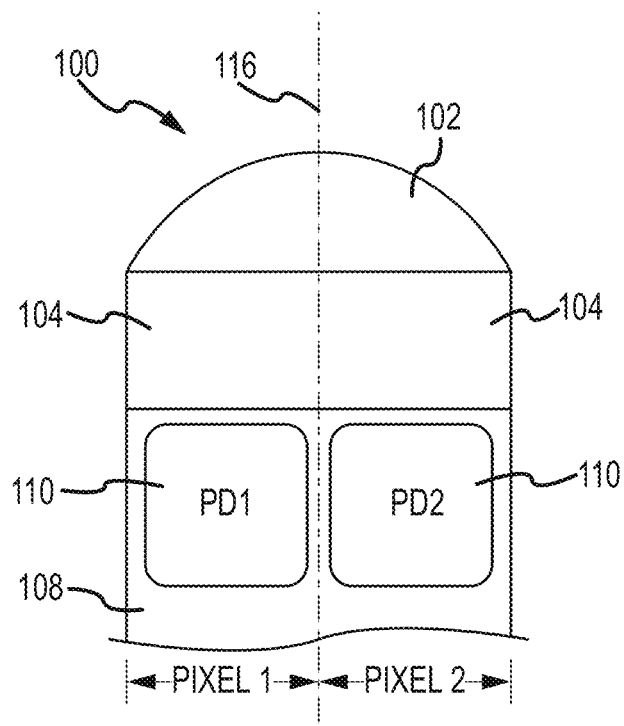
FIG. 2A is a cross-sectional side view of illustrative phase detection pixels having photosensitive regions with different and asymmetric angular responses in accordance with an embodiment.

Image sensors may also be provided with depth sensing capabilities (e.g., to use in automatic focusing applications, 3D imaging applications such as machine vision applications, etc.). To provide depth sensing capabilities, image sensor 14 may include phase detection pixel groups such as phase detection pixel group 100 shown in FIG. 2A. If desired, pixel groups that provide depth sensing capabilities may also provide high dynamic range functionalities. FIG. 2A shows a cross-sectional view of pixel group 100. As shown in FIG. 2A, phase detection pixel group 100 is a pixel pair. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, whereas Pixel 2 may include an associated photosensitive region such as photodiode PD2. A microlens may be formed over photodiodes PD1 and PD2 and may be used to direct incident light towards photodiodes PD1 and PD2.

The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement. In other embodiments, phase detection pixels may be grouped in a 2×2 or 2×4 arrangement. In general, phase detection pixels may be arranged in any desired manner.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to normal optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or backside illumination imager arrangements (e.g., when the photosensitive regions are interposed between the microlens and the metal interconnect circuitry). The example of FIGS. 2A, 2B, and 2C in which Pixels 1 and 2 are backside illuminated image sensor pixels is merely illustrative. If desired, Pixels 1 and 2 may be front side illuminated image sensor pixels. Arrangements in which pixels are backside illuminated image sensor pixels are sometimes described herein as an example.

Figure 2B:
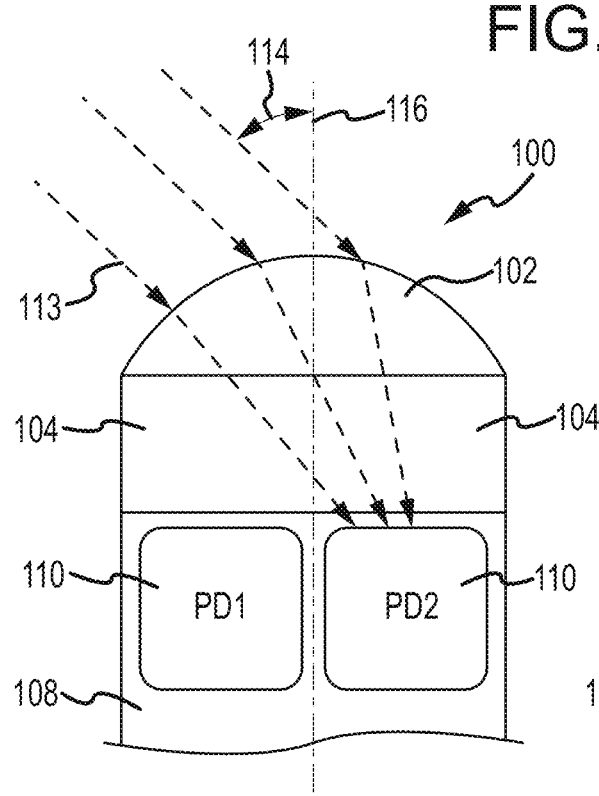
FIGS. 2B and 2C are cross-sectional views of the phase detection pixels of FIG. 2A in accordance with an embodiment.

In the example of FIG. 2B, incident light 113 may originate from the left of normal axis 116 and may reach pixel pair 100 with an angle 114 relative to normal axis 116. Angle 114 may be considered a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
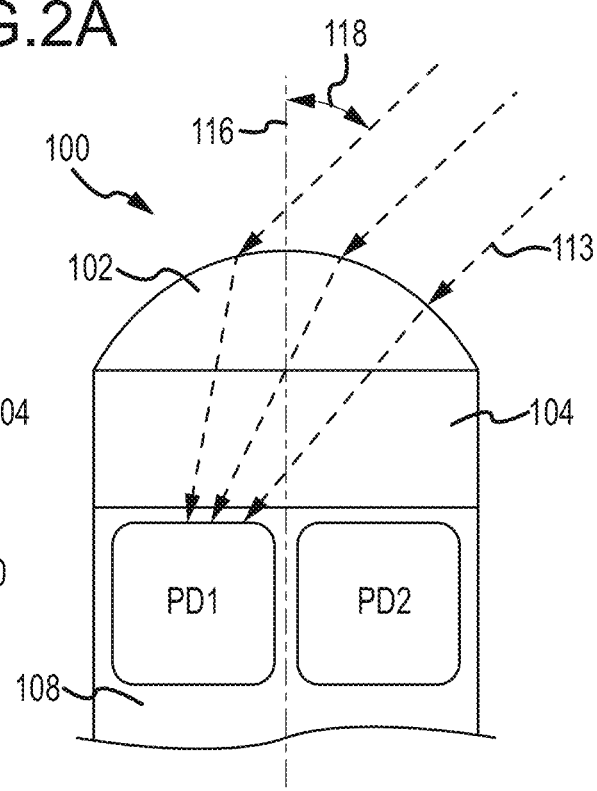

In the example of FIG. 2C, incident light 113 may originate from the right of normal axis 116 and reach pixel pair 100 with an angle 118 relative to normal axis 116. Angle 118 may be considered a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

The positions of photodiodes PD1 and PD2 may sometimes be referred to as asymmetric or displaced positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). It should be noted that the example of FIGS. 2A-2C where the photodiodes are adjacent is merely illustrative. If desired, the photodiodes may not be adjacent (i.e., the photodiodes may be separated by one or more intervening photodiodes).

Figure 3:
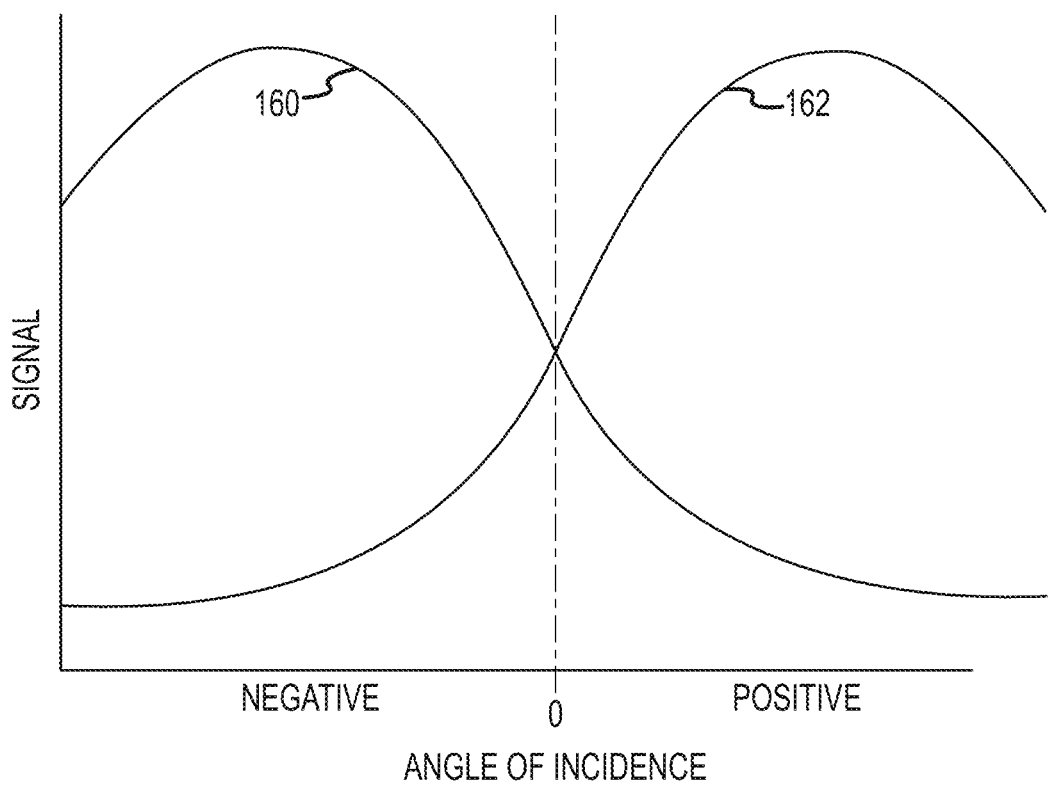
FIG. 3 is a diagram of illustrative signal outputs of photosensitive regions of depth sensing pixels for incident light striking the depth sensing pixels at varying angles of incidence in accordance with an embodiment.

In the plot of FIG. 3, an example of the image signal outputs of photodiodes PD1 and PD2 of pixel pair 100 in response to varying angles of incident light is shown. Line 160 may represent the output image signal for photodiode PD2, whereas line 162 may represent the output image signal for photodiode PD1. For negative angles of incidence, the output image signal for photodiode PD2 may increase (e.g., because incident light is focused onto photodiode PD2), and the output image signal for photodiode PD1 may decrease (e.g., because incident light is focused away from photodiode PD1). For positive angles of incidence, the output image signal for photodiode PD2 may be relatively small, and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100. For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 100 are sometimes referred to herein as phase detection pixels, depth sensing pixels, or phase detection autofocusing ("PDAF") image sensor pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

As previously mentioned, the example in FIGS. 2A-2C where phase detection pixel block 100 includes two adjacent pixels is merely illustrative. If desired, phase detection pixel block 100 may include more than two photosensitive regions of any suitable shape that are covered by varying types of microlenses.

Figure 4:
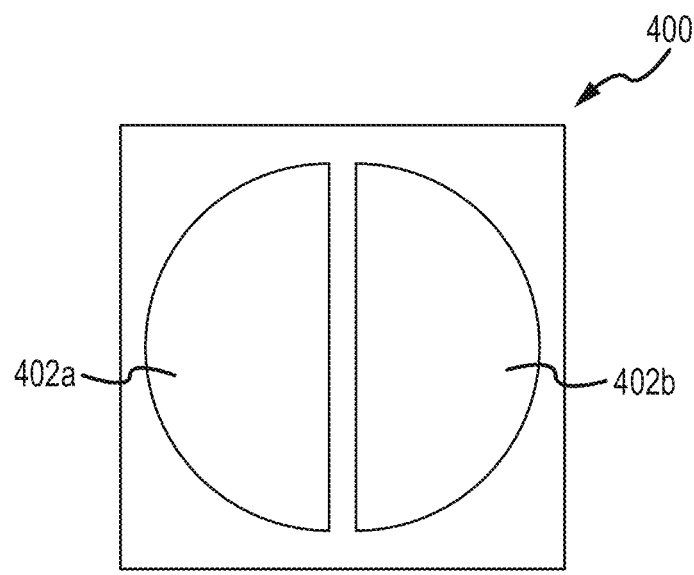
FIG. 4 is a diagram of an illustrative image sensor pixel with depth sensing capabilities in accordance with an embodiment.

FIG. 4 is a diagram of an illustrative image sensor pixel such as pixel 400 with phase detection autofocusing (PDAF) capabilities in accordance with an embodiment. As shown in FIG. 4, pixel 400 may be divided into a first photosensitive region 402a and a second photosensitive region 402b. Regions 402a and 402b may be implemented as photodiode (PD) regions. The two separate photodiode regions can help provide phase detection capabilities, as described above in connection with FIGS. 2 and 3. Photodiode regions 402a and 402b may correspond to n-type doped photodiode regions in a semiconductor substrate (e.g., a p-type substrate). There may be other sub-pixel circuitry formed in the substrate such as charge transfer gates, floating diffusion regions, and reset gates of pixel 400 that are coupled to the photodiode regions, which are not shown so as to not unnecessarily obscure the present embodiments.

Figure 5A:
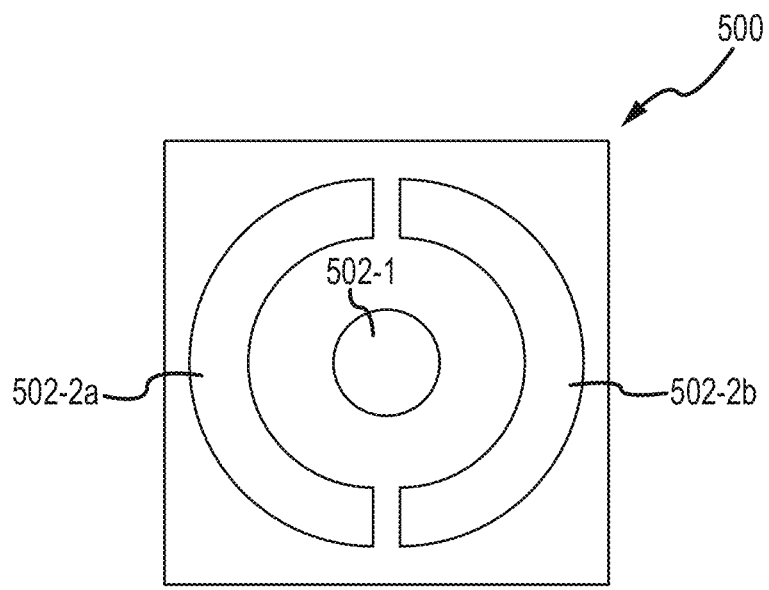
FIG. 5A is a diagram of an illustrative high dynamic range (HDR) toroidal image sensor pixel with depth sensing capabilities in accordance with an embodiment.

An image sensor pixel can further be subdivided into light collecting regions having different areas to provide high dynamic range (HDR) functionality. FIG. 5A is a diagram of an illustrative high dynamic range (HDR) toroidal image sensor pixel 500 with depth sensing capabilities. As shown in FIG. 5A, pixel 500 may include a first sub-pixel 502-1, which may be referred to as the inner sub-pixel or the inner photodiode region. The inner sub-pixel may be surrounded by a second sub-pixel, which may be referred to as the outer sub-pixel or the outer photodiode region. The outer sub-pixel of pixel 500 may be divided into regions 502-2a and 502-2b (sometimes referred to as outer photodiode regions). Configured in this way, the inner sub-pixel 502-1 has a smaller surface area and is thus more suitable for imaging high light regions, whereas the outer sub-pixels 502 have a larger surface area and are thus more suitable for imaging low light regions.

The example of FIG. 5A in which HDR PDAF pixel 500 is divided into two outer sub-regions is merely illustrative and does not serve to limit the scope of the present embodiments. If desired, the outer sub-pixel 502-2 can be divided into at least three photodiode regions], at least four photodiode regions, at least six photodiode regions, or any suitable number of sub-regions of the same or different shape/area to provide phase detecting autofocusing capabilities.

Figure 5B:
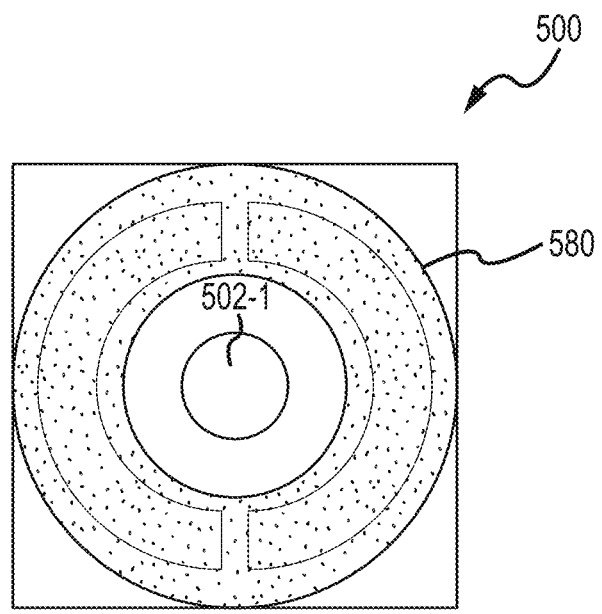
FIGS. 5B and 5C are diagrams showing different microlens configurations that can be used to support HDR capability in accordance with an embodiment.
Figure 5C:
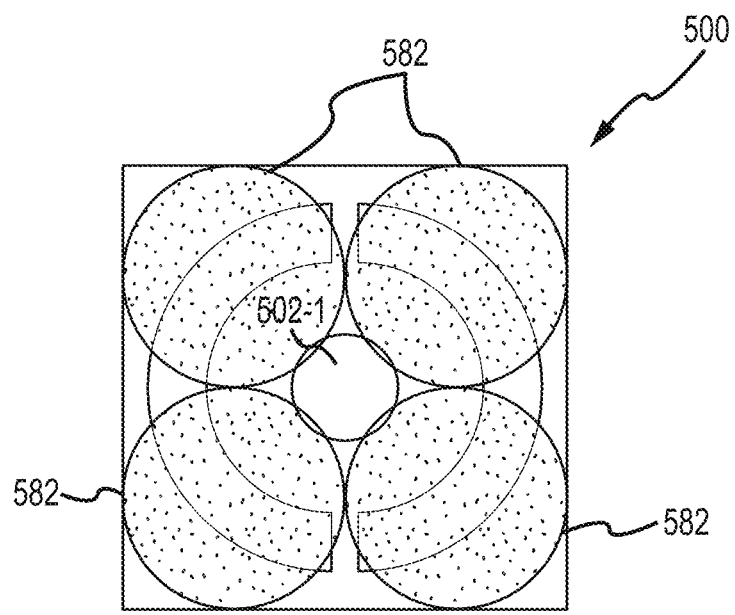

A semi-toroidal microlens such as microlens 580 (see, e.g., FIG. 5B) may be formed over each pixel 500. Microlens 580 may have a central region surrounded by a semi-toroid region. The central region of microlens 580 is formed directly over inner sub-pixel 502-1 and is configured to focus light towards inner sub-pixel 502-1. The semi-toroid region of microlens 580 is formed directly over outer sub-pixels 502-2a and 502-2b and is configured to focus light towards output sub-pixels 502-2a and 502-2b. Pixel 500 having a semi-toroidal (or "donut-shaped") microlens 580 is sometimes referred to as a toroidal image sensor pixel. Configured in this way, image sensor pixel 500 may provide both high dynamic range and phase detecting auto-focusing functionalities. In general, a toroidal microlens is not essential to provide the HDR capability. FIG. 5C shows another example having four convex microlenses 582 arranged in a 2×2 pattern over pixel 500, where each microlens is shifted outwards to create an opening in the center. This configuration can also provide the same HDR benefit (albeit sacrificing the PDAF functionality). In general, other microlenses shapes are also feasible.

Figure 6:
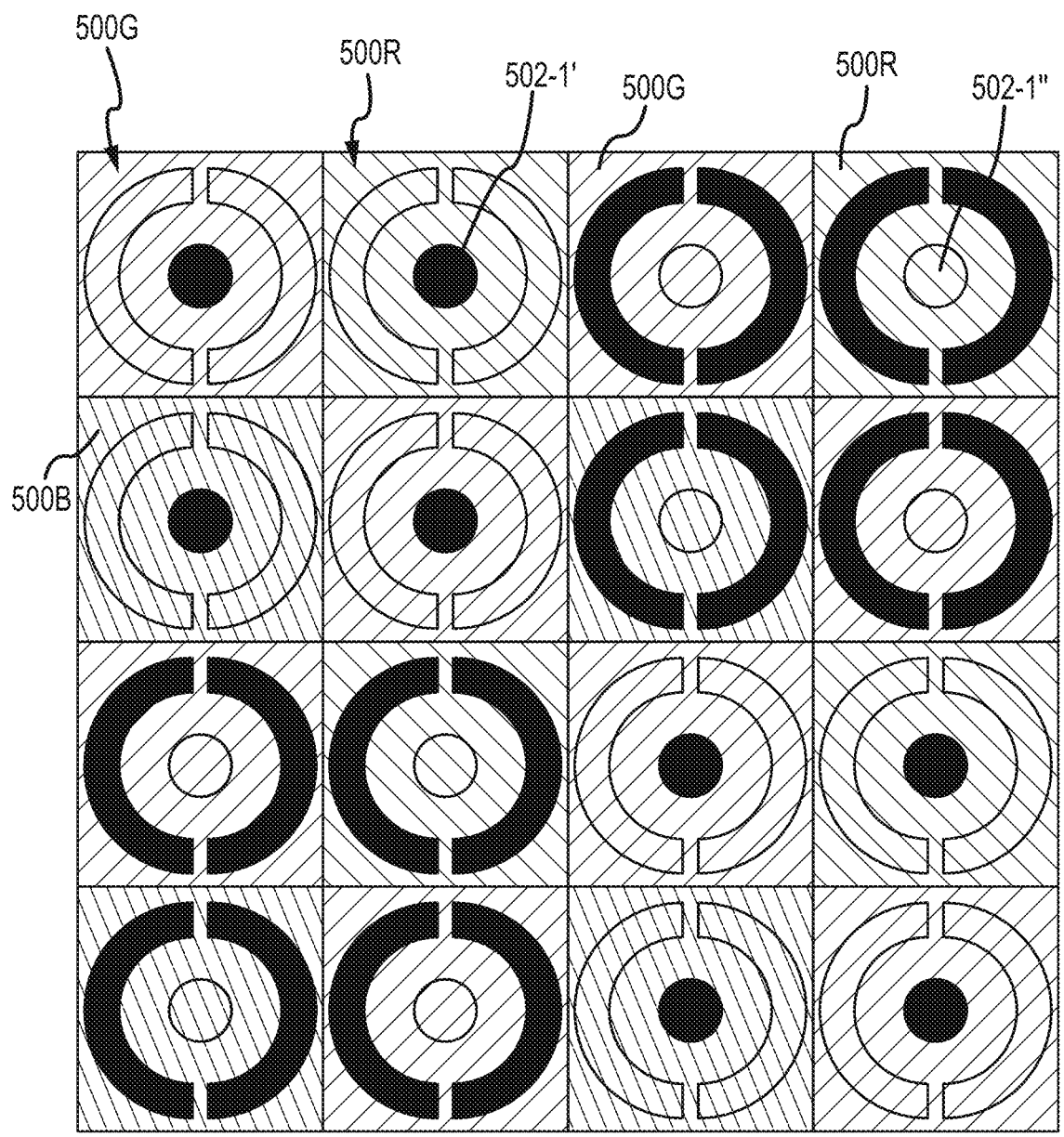
FIG. 6 is a diagram of an illustrative array of HDR toroidal image sensor pixels with a color filter array (CFA) and infrared (IR) block filters in accordance with an embodiment.

In accordance with another embodiment, pixel 500 may be included in an array that is provided with both color and infrared sensing capabilities. FIG. 6 is a diagram of an illustrative array of HDR toroidal image sensor pixels with a color filter array (CFA) and infrared (IR) block filters in accordance with an embodiment. As shown in FIG. 6, a Bayer color filter pattern may be used. If the sixteen pixels are divided into four quadrants each having four pixels, each quadrant will have a green-red-green-blue (GRGB) color filter pattern. Each green pixel 500G is covered by a green color filter that only passes through the green wavelength. Each red pixel 500R is covered by a red color filter that only passes through the red wavelength. Each blue pixel 500B is covered by a blue color filter that only passes through the blue wavelength.

In additional to having a color filter, each pixel 500 may also be provided with an infrared filter. In the example of FIG. 6, pixels in the upper left quadrant are each provided with an infrared (IR) block filter that blocks the IR wavelength for the corresponding inner sub-pixel, whereas pixels in the upper right quadrant are each provided with an IR block filter that blocks the IR wavelength for the corresponding outer sub-pixels. The photodiode regions having IR blocking are shown as solid black regions in FIG. 6. For example, sub-pixel 502-1' will be configured to collect charge generated from red light without any IR contribution, whereas sub-pixel 502-1" in an adjacent quadrant will be configured to collect charge generated from red light with IR contribution. By comparing the charge collected by sub-pixel 502-1' with the charge collected by sub-pixel 502-1" (e.g., by subtracting the amount of charge collected at sub-pixel 502-1' from the amount of charged collected at sub-pixel 502-1"), an IR amount for high light regions can be obtained. The amount of infrared contribution for low light regions can also be computed by comparing the charge collected by the outer sub-pixels without any IR blocking with the charge collected by the outer sub-pixels with IR blocking.

In this example, two pixels from two different quadrants (e.g., a first pixel 500R in which sub-pixel 502-1' is formed and a second pixel 500R in which sub-pixel 502-1" is formed) are needed to compute a single corresponding IR signal output. Thus, the infrared resolution may only be half of the overall full color resolution of the image sensor. In other suitable arrangements, the center IR blocking as shown in the upper left and lower right quadrants in FIG. 6 are optional and need not be used if only low light IR sensing is required. In yet other suitable arrangements, the outer IR blocking as shown in the upper right and lower left quadrants in FIG. 6 are optional and need not be used if only high light IR sensing is required.

Figure 7A:
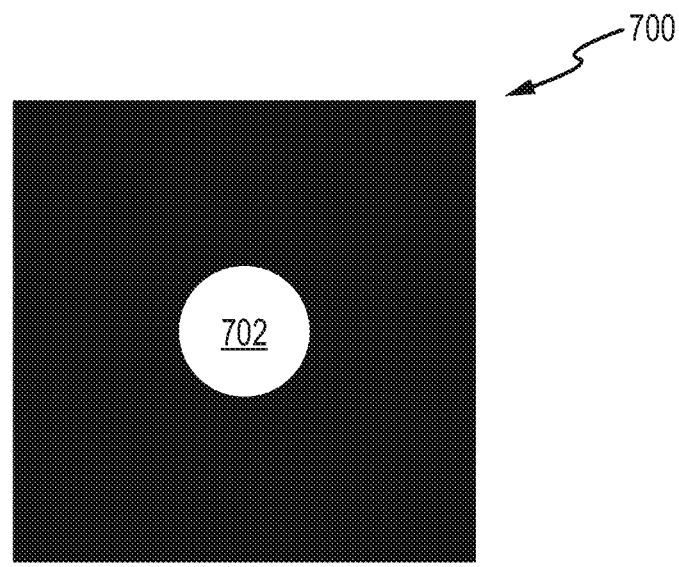
FIG. 7A is a diagram of an infrared block filter layer configured to filter out infrared wavelengths for the low-light photosensitive regions in an HDR toroidal image sensor pixel in accordance with an embodiment.

The IR blocking functionality of each image pixel may be provided by a filter layer that is separate from the color filter layer. FIG. 7A is a diagram of an infrared block filter layer configured to filter out infrared wavelengths for the low-light photosensitive regions in an HDR toroidal image sensor pixel in accordance with an embodiment. As shown in FIG. 7A, IR block filter 700 may have an opening 702 that is at least as large as the inner sub-pixel of each HDR toroidal pixel. Opening 702 may be clear and may not provide any light filtering. Areas of filter 700 surrounding opening 702, which is shown as a solid black region, may be IR-opaque and may include material that blocks light between approximately 700-900 nanometers (nm) but passes light with wavelengths less than 700 nm and greater than 900 nm (as an example). This is merely illustrative. In another suitable example, filter 700 may be configured to suppress wavelengths between 850-900 nm. In the IR-opaque (solid black) regions, infrared light transmission may be reduced to less than 40%, less than 20%, less than 10%, or almost 0%.

Figure 7B:
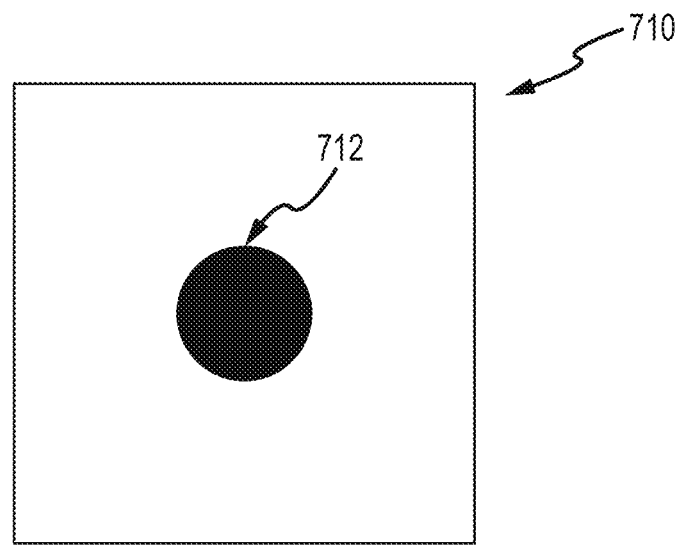
FIG. 7B is a diagram of an infrared block filter layer configured to filter out infrared wavelengths for the high-light photosensitive region in an HDR toroidal image sensor pixel in accordance with an embodiment.

FIG. 7B is a diagram of infrared block filter 710 configured to filter out infrared wavelengths for the high-light photosensitive region in an HDR toroidal image sensor pixel. As shown in FIG. 7B, IR block filter 710 may have a circular IR-opaque region 712 that is at least as large as the inner sub-pixel of each HDR toroidal pixel. Areas of filter 710 surrounding solid black region 712 may be clear and may not provide any light filtering. Similar to the solid black region of filter 700 in FIG. 7A, region 712 of filter 710 in FIG. 7B may include any suitable filtering material for suppressing IR light transmission (e.g., to reduce infrared light transmission to less than 30%, less than 20%, less than 10%, less than 5%, etc.).

Figure 7C:
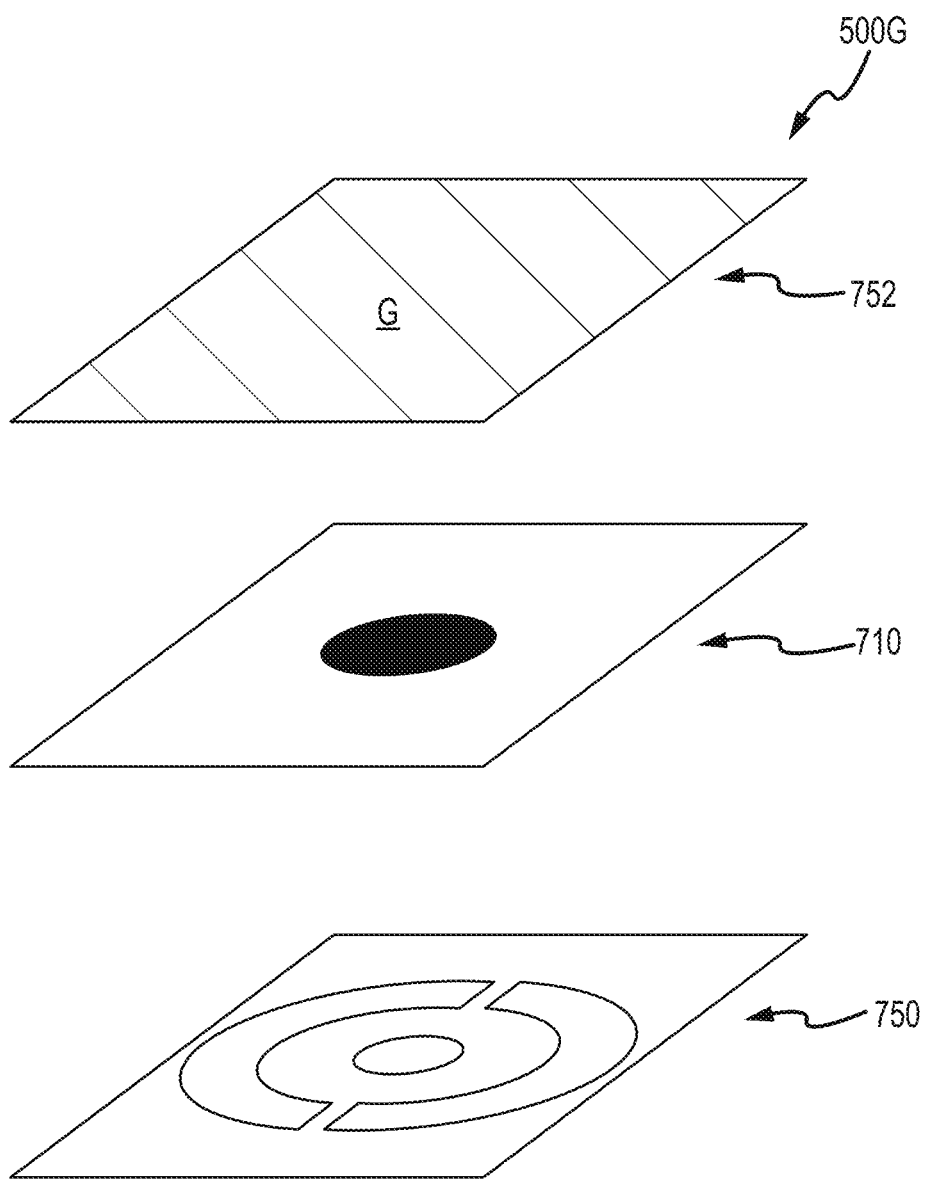
FIG. 7C is an exploded view of a green HDR toroidal image sensor pixel with an infrared block filter layer configured to filter out infrared wavelengths for the high-light photosensitive region in accordance with an embodiment.

FIG. 7C is an exploded view of a green HDR toroidal image sensor pixel such as pixel 500G with infrared block filter layer 710. As shown in FIG. 7C, pixel 500G may include a photodiode layer 750, a color filter layer 752, and an IR block filter layer 710 interposed between layers 750 and 752. Pixel 500G in the upper left corner of FIG. 6 may be implemented in this way. In general, any color filter layer can be combined with filter 700 of FIG. 7A, filter 710 of FIG. 7B, or other suitable IR filtering layer to implement an HDR pixel with selective IR suppression. The example of FIG. 7C in which IR blocking layer 710 is formed below color filter layer 752 is merely illustrative. In another suitable arrangement, the IR blocking layer may instead be formed above the color filter layer (e.g., the color filter layer may be interposed between the IR filter and the photodiode layer).

Figure 8A:
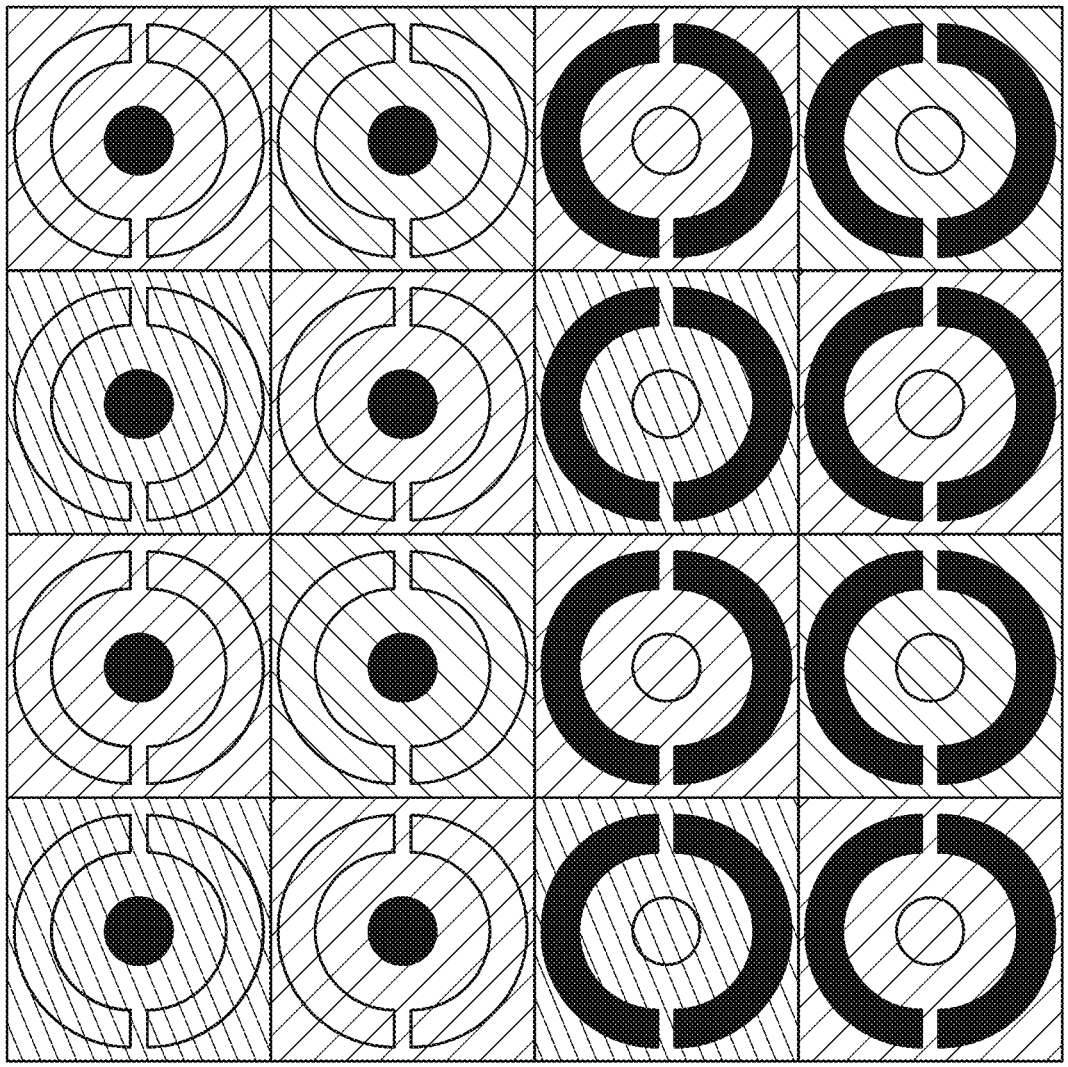
FIGS. 8A-8E show various suitable color filter array (CFA) layout arrangements with different infrared block filter patterns in accordance with at least some embodiments.
Figure 8B:
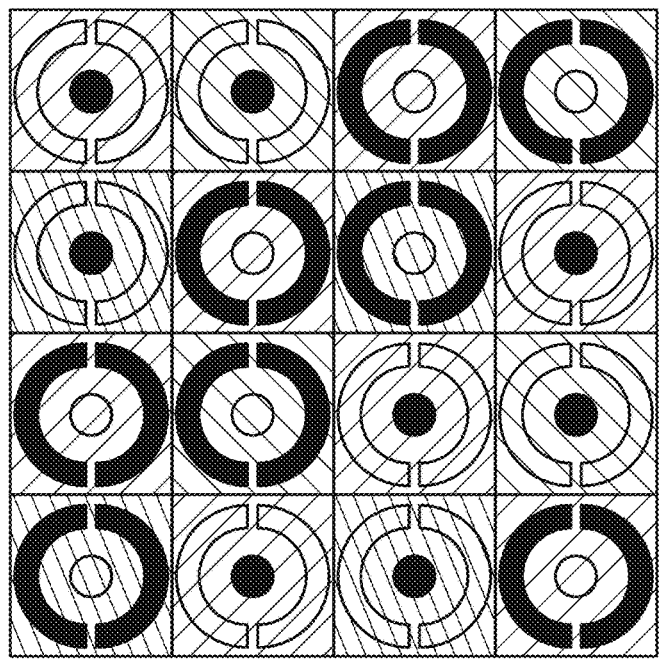
Figure 8C:
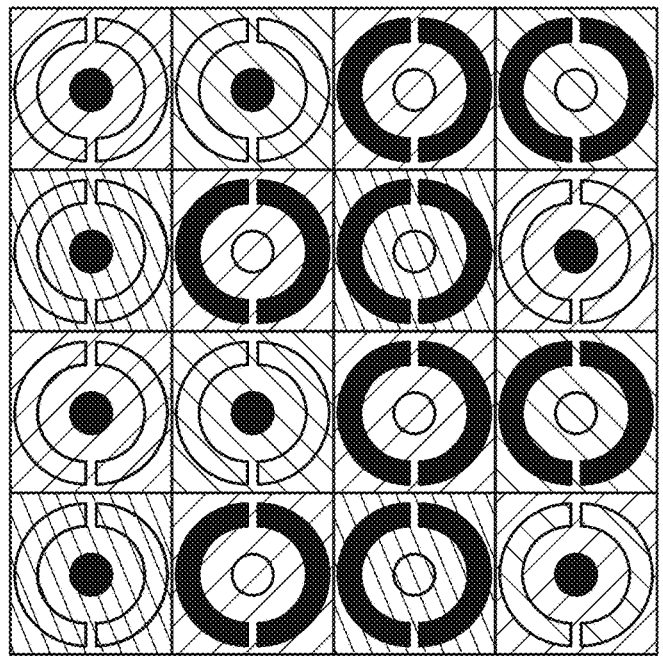
Figure 8D:
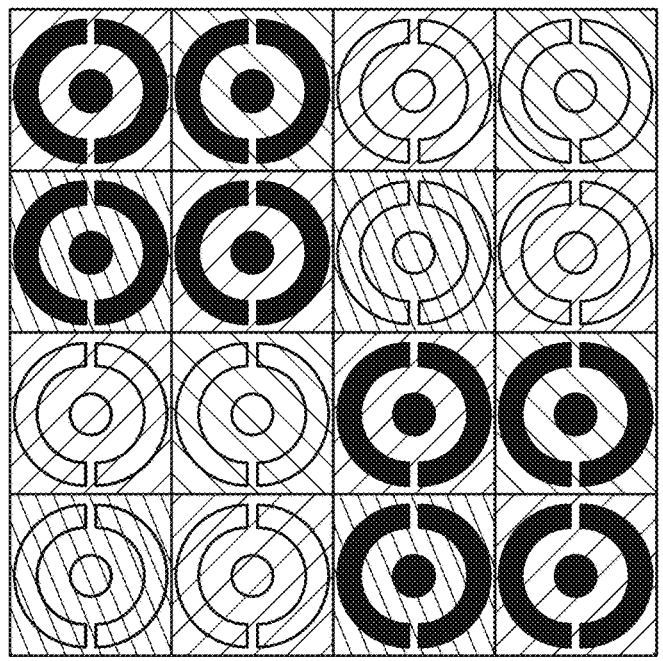
Figure 8E:
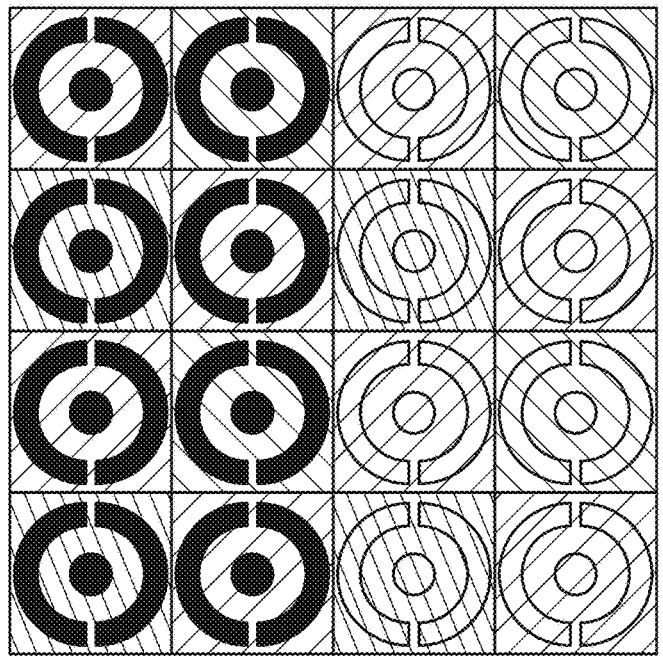

FIGS. 8A-8E show various suitable color filter array (CFA) layout arrangements with different infrared block filter patterns in accordance with at least some embodiments. FIG. 8A shows an exemplary configuration in which each column includes only high-light region IR blocking or low-light region IR blocking (e.g., the first and second columns include only central IR blocking, whereas the third and fourth columns include only peripheral IR blocking). FIGS. 8B and 8C show how the IR blocking may be varied from one quadrant to another. FIG. 8D shows how IR blocking may be organized in a checkerboard pattern (e.g., only the top left and bottom right quadrants have a blanket IR blocking, whereas the top right and bottom left quadrants have no IR blocking). FIG. 8E shows how show IR blocking may be organized in a striped pattern (e.g., only the first and second columns have a blanket IR filtering, whereas the third and fourth columns have no IR filter). The exemplary layout configurations of FIGS. 8A-8E may be repeated across an image sensor array having hundreds, thousands, or millions of pixels. If desired, other suitable regular or randomized color/IR filtering patterns may also be implemented.

Figure 9A:
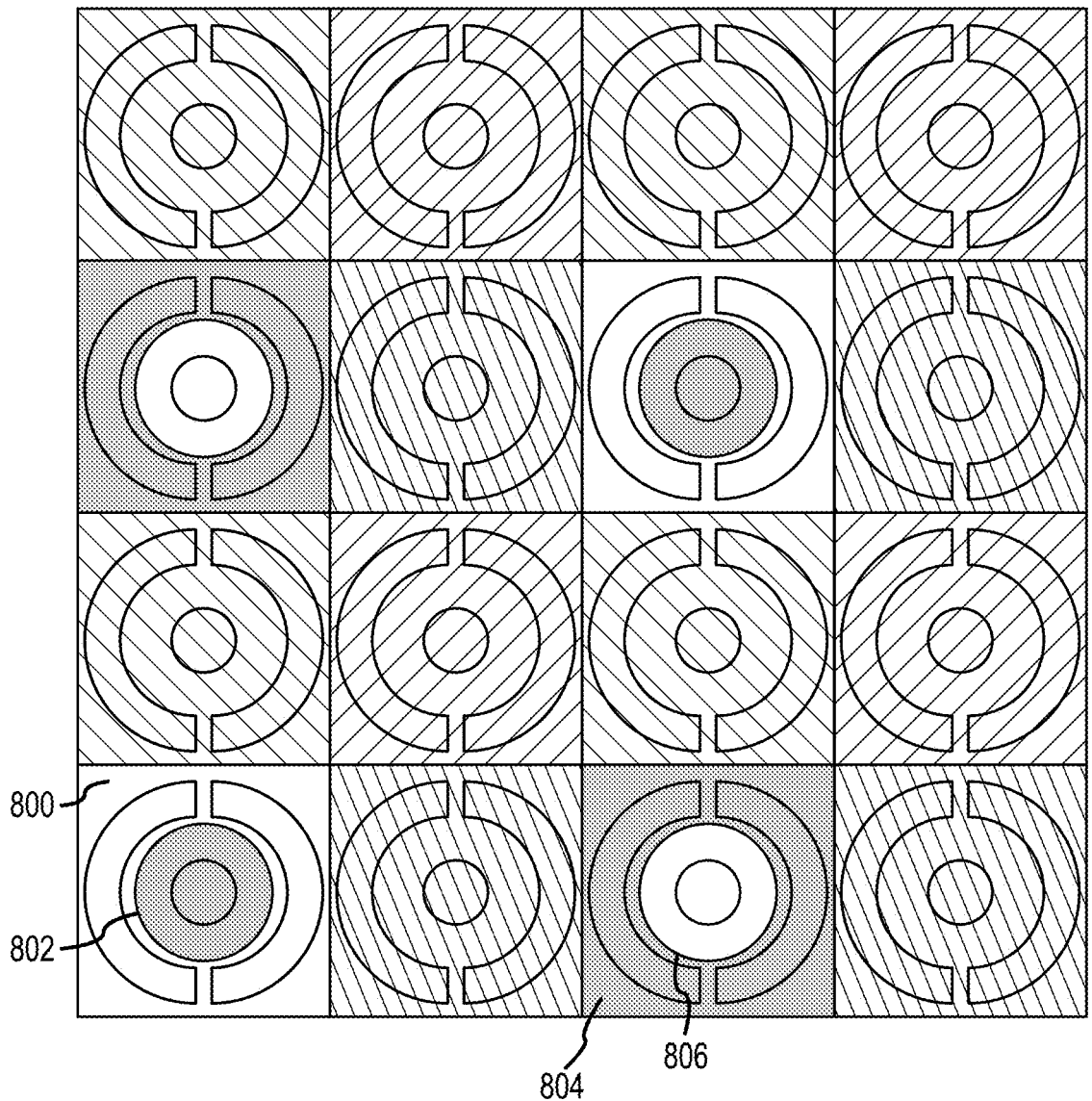
FIG. 9A-9C show various suitable color filter array (CFA) layout arrangements with different infrared pass filter patterns in accordance with at least some embodiments.
Figure 9B:
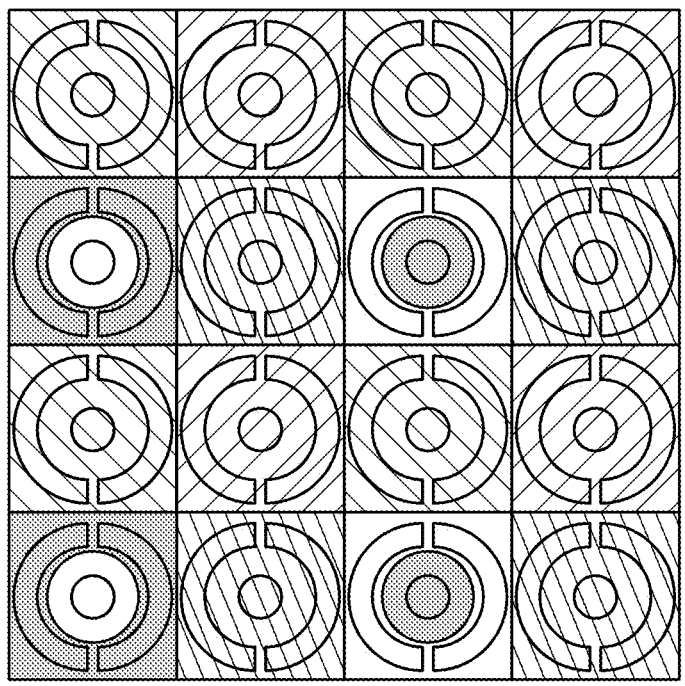
Figure 9C:
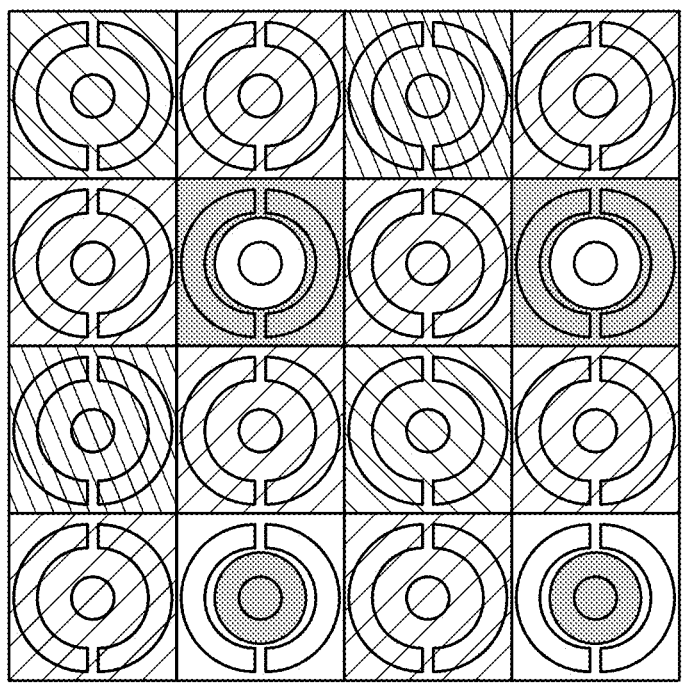

The embodiments of FIGS. 6-8 are directed towards image sensor pixels having an IR block filter. In another suitable arrangement, image sensor pixels may be provided with a selective IR pass filter. FIG. 9A-9C show various suitable color filter array (CFA) layout arrangements with different infrared pass filter patterns. FIG. 9A shows an illustrative configuration of HDR toroidal pixels with a Bayer color filter pattern, except with one of the green color filter replaced with a filter having a first portion that is clear and a second portion that pass infrared wavelengths.

In the example of FIG. 9A, the lower left quadrant has a pixel in the bottom left corner with a first portion 800 that is clear (e.g., a broadband filter that passes through red, green, blue, infrared light, and/or other suitable wavelengths) and a second portion 802 that only passes IR. Portion 800 may completely surround portion 802. Second portion 802 may at least cover the inner sub-pixel (e.g., the diameter of portion 802 is at least as wide as the diameter of the corresponding inner sub-pixel). Second portion 802 may be implemented using an IR filtering layer with material that blocks wavelengths below 800 nm (e.g., by reducing the transmission level to less than 20% or less than 10%) and transmits wavelengths above 800 nm (e.g., by allowing transmission to be greater than 90% or close to 100%). The 800 nm threshold is merely illustrative. In other suitable arrangements, the threshold wavelength may be approximately 600 nm, 700 nm, 850 nm, or other suitable cutoff.

The lower right quadrant has a pixel in the bottom left corner with a first portion 804 that only passes IR and a second portion 806 that is clear. Portion 804 may completely surround portion 806. Second portion 806 may at least cover the inner sub-pixel (e.g., the diameter of portion 806 is at least as wide as the diameter of the corresponding inner sub-pixel). Similar to portion 802, portion 804 may be implemented using an IR filtering layer with material that blocks wavelengths at a desired threshold wavelength while passing light above the threshold wavelength.

By comparing the charge collected by the inner sub-pixel covered by portion 802 with the charge collected by the inner sub-pixel covered by portion 806 (e.g., by subtracting the amount of charge collected by the inner sub-pixel covered by portion 802 from the charge collected by the inner sub-pixel covered by portion 806), an IR amount for high light regions can be obtained. The amount of infrared contribution for low light regions can also be computed by comparing the charge collected by the outer sub-pixels covered by portion 800 with the charge collected by the outer sub-pixels covered by portion 804. In this example, two pixels from two different quadrants (i.e., the two lower quadrants are described above) are needed to compute a single corresponding IR signal output. Thus, the infrared resolution may only be half of the overall color resolution of the image sensor.

FIGS. 9B and 9C show other suitable filtering arrangements that include selective IR pass filters. In the example of FIG. 9B, the type of IR pass filters may be the same in each column (e.g., all IR pass filters in the first column covers the outer sub-pixels, whereas all IR pass filters in the third column covers the inner sub-pixels).

In the example of FIG. 9C, each quadrant is different. The upper left quadrant has the IR pass filter selectively covering the outer sub-pixels in the lower right corner of that quadrant (where the blue pixel typically sits). The upper right quadrant has the IR pass filter selectively covering the outer sub-pixels also sitting at the lower right corner of that quadrant, but a blue pixel is now formed in the upper left corner of that quadrant (where the red pixel typically sits). The bottom right quadrant has the IR pass filter selectively covering the inner sub-pixel in the lower right corner of that quadrant (where the blue pixel typically sits). The lower left quadrant has the IR pass filter selectively covering the inner sub-pixel also sitting at the lower right corner of that quadrant, but a blue pixel is now formed in the upper left corner of that quadrant (where the red pixel typically sits). This configuration in which each quadrant is different is sometimes referred to as the 4×4 super-pixel layout.

The exemplary layout configurations of FIGS. 9A-9C may be repeated across an image sensor array having hundreds, thousands, or millions of pixels. If desired, other suitable regular or randomized IR pass filtering patterns may also be implemented.

In general, the IR filter layer may be formed above or below the color filter layer. FIGS. 10A and 10B are cross-sectional side views of image sensors in which the infrared blocking filters are formed above the color filter array in accordance with at least some embodiments. As shown in FIG. 10A, the photodiodes (e.g., inner sub-pixel 502-1 and outer sub-pixels 502-2a and 502-2b) may be formed in a semiconductor substrate 900 (e.g., a p-type silicon substrate). Substrate 900 may have a front surface and a back surface. The photodiodes may be formed by implanting dopants via the front surface.

A dielectric stack 902 may be formed on the front surface of substrate 900. Dielectric stack 902 may include alternating metal routing layers and via layers, which are sometimes referred to collectively as interconnect routing structures 903. If desired, at least a portion of structures 903 may be configured as a light reflector for bouncing light back towards the photodiodes. Dielectric stack 902 is sometimes referred to as an interconnect stack. A carrier layer 904 (e.g., a silicon carrier) may be permanently attached to dielectric stack 902 to provide mechanical rigidity and robustness for the image sensor. In the case of a stacked image sensor, carrier layer 904 would be a separate ASIC (application-specific integrated circuit) wafer, and there would be electrical connections between the ASIC wafer and the stacked sensor wafer.

The back surface of substrate 900 may be thinned by grinding against the back side of substrate 900 via chemical mechanical polishing (CMP) or other suitable thinning means. Deep trench isolation structures 906 may then be formed at the back surface of substrate 900 to physically and electrically isolate adjacent photodiode regions. Structures 906 formed at the back side of substrate 900 may therefore be referred to as backside deep trench isolation ("BDTI") structures. BDTI structures 906 formed between the inner and outer sub-pixels within a single pixel help reduce color crosstalk for that pixel, whereas BDTI structures 906 formed between adjacent pixels help reduce pixel crosstalk. Liner 908 may then be formed on the back surface of substrate 900. Liner 908 may include an IR absorption enhancement layer, an antireflection coating layer (e.g., a hafnium oxide layer, tantalum oxide layer, aluminum oxide layer, etc.), and/or a passivation layer (e.g., a silicon oxide layer, a silicon nitride layer, etc.).

Color filter layer 910 may then be formed on liner 908. Color filter layer 910 may include red color filter elements, green color filter elements, blue color filter elements, cyan color filter elements, magenta color filter elements, yellow color filter elements, and other suitable color filter elements. Infrared block filter layer 912 may then be formed on color filter layer 910. Layer 912 may only cover a portion of the pixels. In the example of FIG. 10A, the infrared block filter completely covers the two rightmost pixels. The two leftmost pixels are not covered by any IR filter. Planarization (PLN) material fills layer 912 that is not occupied by the IR filter material. Toroidal microlenses such as microlenses 914 may then be formed over layer 912. The cross-section of FIG. 10A is similar to the first row shown in FIG. 8E.

FIG. 10B shows another suitable arrangement in which the different color filter elements in layer 910 are inserted into corresponding color filter housing structures 950. Elements of FIG. 10B with the same structure as those already identified in FIG. 10A are not labeled again so as to not obscure the present embodiment. Color filter housing structures 950 may include an array of slots in which individual color filter elements may be inserted. An array of color filter elements that are contained within such types of housing structures are sometimes referred to as a CFA-in-a-box (abbreviated as "CIAB"). Color filter array housing structures 950 may have walls that are formed from a dielectric material (e.g., silicon oxide) and may serve to provide improved light guiding capabilities for directing light to desired image sensor pixels.

Figure 11A:
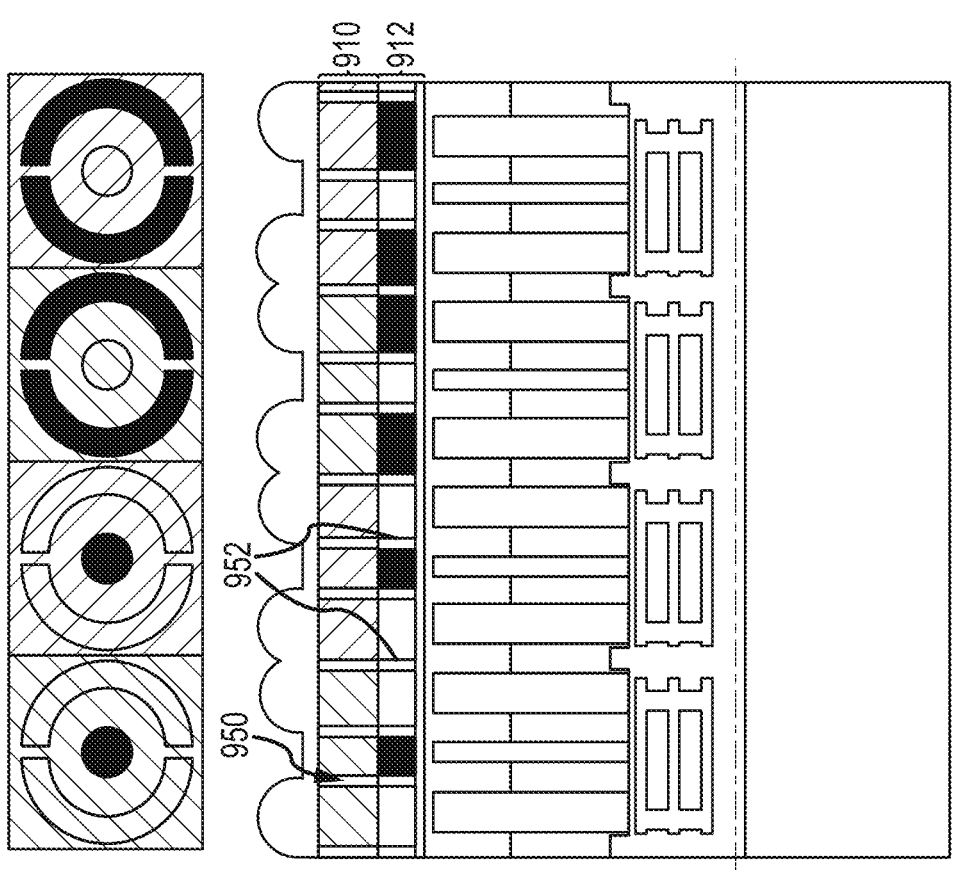
FIGS. 11A-11C are cross-sectional side views of image sensors in which the infrared blocking filters are formed below the color filter array in accordance with at least some embodiments.
Figure 11B:
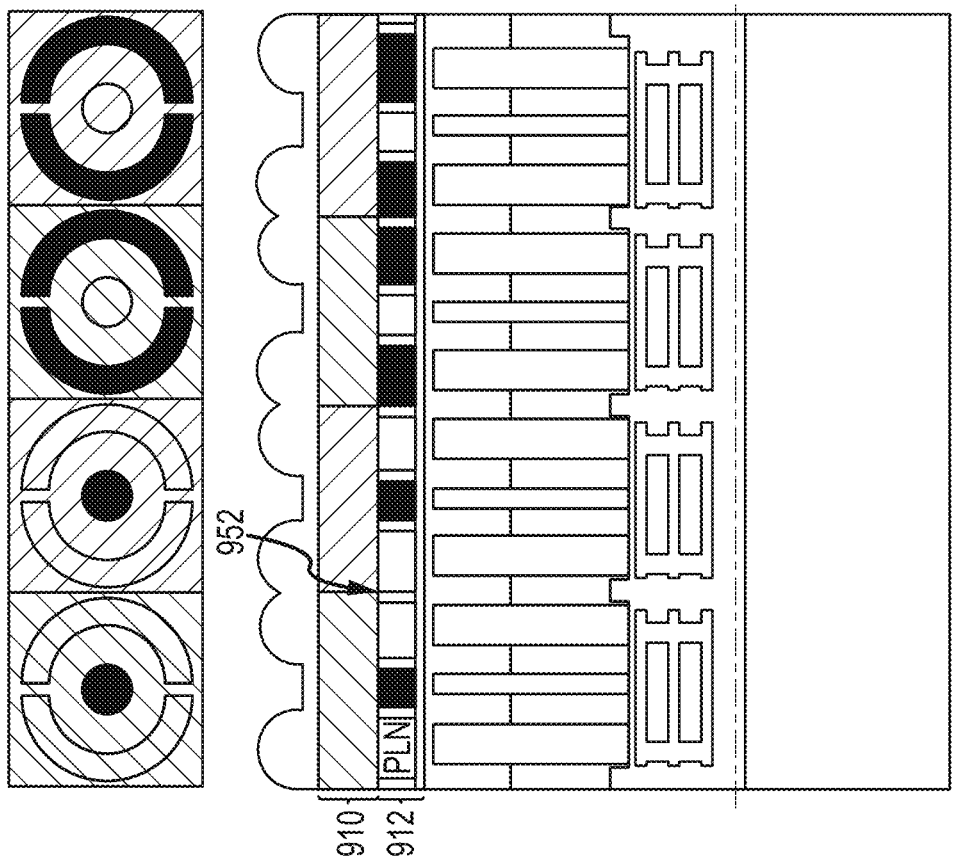
Figure 11C:
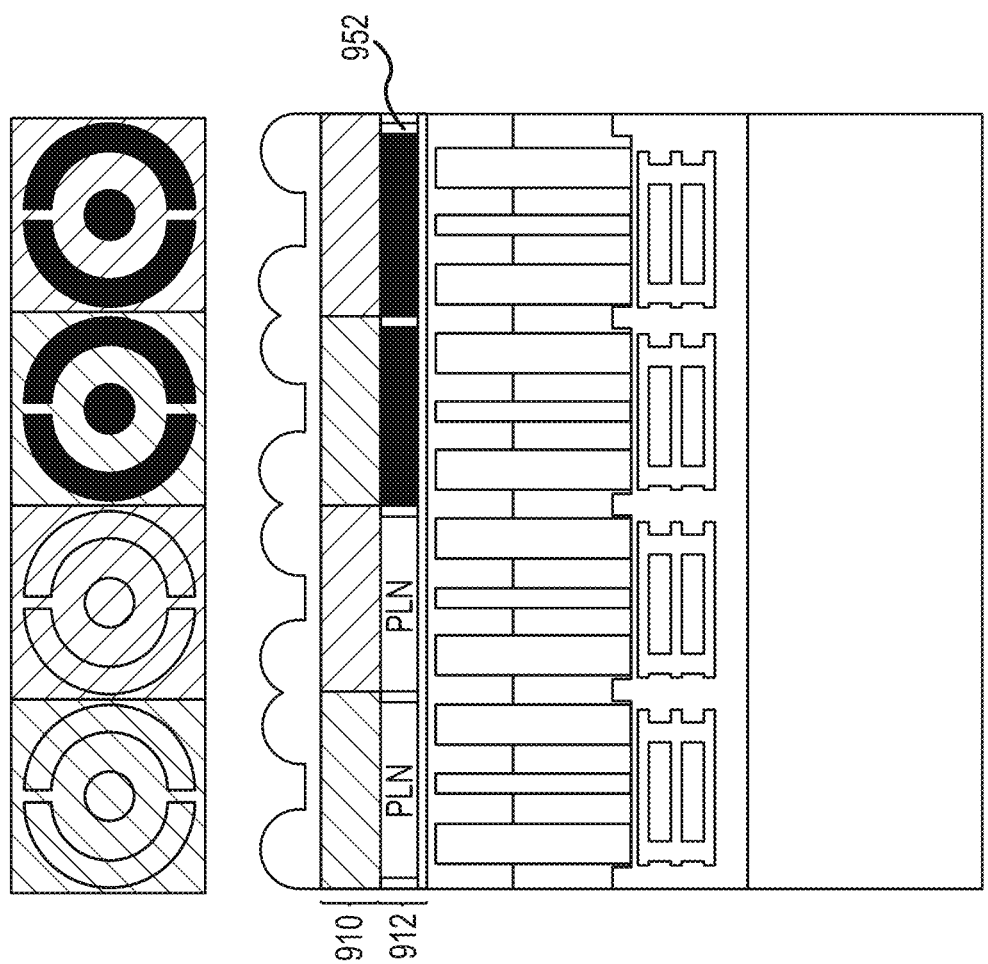

In other suitable arrangements, the IR blocking filters may be formed below the color filters. FIGS. 11A-11C are cross-sectional side views of image sensors in which the infrared blocking filters are formed below the color filter array. The cross-section of FIG. 11A is similar to the first row shown in FIG. 6. Elements of FIGS. 11A-11C with the same structure as those already identified in FIG. 10A are not labeled again so as to not obscure the present embodiment.

As shown in FIG. 11A, IR block filter layer 912 is formed below color filter layer 910. Moreover, an in-pixel grid structure such as in-pixel grid 952 may be formed within layer 912. In-pixel grid 952 is configured as a grid-like structure having walls that separate the IR blocking material from the planarization material. Grid 952 may be formed from oxide, metal, or a combination of metal and oxide. Configured in this way, in-pixel grid 952 can further reduce pixel and color crosstalk. The example of FIG. 11B further includes CFA housing structures 950 in color filter layer 910 (e.g., the pixels of FIG. 11B include both a CIAB and an in-pixel grid). FIG. 11C illustrates another variable of FIG. 10A, where IR filter layer 912 is formed below color filter layer 910 and where IR filter layer 912 includes in-pixel grid 952.

In general, an image sensor may be implemented using any suitable color filter array pattern with any amount of IR block or pass filtering. The IR filter layer may be formed above or below the color filter layer. Color filter housing structures may be optionally formed in the color filter layer. In-pixel grid structures may be optionally formed in the IR filter layer. Moreover, the embodiments of FIGS. 1-11 may be applied to image sensors operated in a rolling shutter mode or a global shutter mode. Although a BSI configuration is preferred, the PDAF and HDR pixels described in connection with FIGS. 1-11 may also be applied to a front side illuminated imaging system.

The foregoing is merely illustrative of the principles of this invention and various modifications can be made by those skilled in the art without departing from the scope and spirit of the invention.

What is claimed is:

1. An image sensor comprising:
   a first pixel having an inner photodiode region and an outer photodiode region, wherein the outer photodiode region of the first pixel is covered by infrared filtering material; and
   a second pixel having an inner photodiode region and an outer photodiode region, wherein the outer photodiode region of the second pixel is not covered by any infrared filtering material,
   wherein the first pixel and the second pixel are covered by respective color filter materials for passing a same color,
   and wherein charge collected by the first pixel is compared with charge collected by the second pixel to provide infrared sensing.

2. The image sensor of claim 1, wherein the inner photodiode region of the first pixel is not covered by any infrared filtering material, and wherein the inner photodiode region of the second pixel is covered by the infrared filtering material.

3. The image sensor of claim 1, wherein the infrared filtering material blocks infrared light.

4. The image sensor of claim 1, wherein the infrared filtering material passes infrared light.

5. The image sensor of claim 4, wherein the respective color filter materials covering the first and second pixels comprise a clear color filter formed over each of the first and second pixels.

6. The image sensor of claim 5, wherein the inner photodiode region of the first pixel is not covered by any infrared filtering material, and wherein the inner photodiode region of the second pixel is covered by the infrared filtering material.

7. The image sensor of claim 1, further comprising a third pixel having an inner photodiode region and an outer photodiode region, wherein the inner and outer photodiode regions of the third pixel are not covered by any infrared filtering material.

8. The image sensor of claim 1, wherein the respective color filter materials are formed on a layer that is separate from a layer on which the infrared filtering material is formed.

* * * * *